United States Patent
Chung et al.

(10) Patent No.: US 9,110,104 B2
(45) Date of Patent: Aug. 18, 2015

(54) VOLTAGE-TEMPERATURE SENSOR AND SYSTEM INCLUDING THE SAME

(75) Inventors: Kun-Young Chung, Hwaseong-si (KR); Dong Jiao, Mountain View, CA (US); Ming Zhang, Foster City, CA (US)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 266 days.

(21) Appl. No.: 13/482,033

(22) Filed: May 29, 2012

(65) Prior Publication Data
US 2012/0307867 A1    Dec. 6, 2012

(30) Foreign Application Priority Data

Jun. 1, 2011    (KR) .................. 10-2011-0052701

(51) Int. Cl.
| | |
|---|---|
| *G01K 7/00* | (2006.01) |
| *G01K 3/00* | (2006.01) |
| *G01R 19/00* | (2006.01) |
| *G01K 7/32* | (2006.01) |
| *G01R 31/28* | (2006.01) |

(52) U.S. Cl.
CPC .............. *G01R 19/0084* (2013.01); *G01K 7/32* (2013.01); *G01R 31/2853* (2013.01)

(58) Field of Classification Search
USPC ........................... 374/170, 112, 166; 327/512
See application file for complete search history.

(56) References Cited

U.S. PATENT DOCUMENTS

| | | | | |
|---|---|---|---|---|
| 5,638,418 | A * | 6/1997 | Douglass et al. | 377/25 |
| 6,307,496 | B1 * | 10/2001 | Ikuta et al. | 341/155 |
| 7,914,204 | B2 | 3/2011 | Kim et al. | |
| 8,031,011 | B2 * | 10/2011 | Moussavi et al. | 331/57 |
| 8,317,393 | B2 * | 11/2012 | Chen et al. | 374/170 |
| 2010/0145652 | A1 * | 6/2010 | Casasso et al. | 702/130 |
| 2010/0171558 | A1 * | 7/2010 | Kim et al. | 331/57 |
| 2010/0182852 | A1 * | 7/2010 | Joo et al. | 365/189.09 |
| 2011/0043393 | A1 * | 2/2011 | Tamura | 341/119 |
| 2012/0075137 | A1 * | 3/2012 | Tanizawa | 341/157 |
| 2012/0307866 | A1 * | 12/2012 | Chen | 374/170 |

FOREIGN PATENT DOCUMENTS

| | | |
|---|---|---|
| JP | 2006-170936 | 6/2006 |
| KR | 1020090002487 | 1/2009 |

* cited by examiner

*Primary Examiner* — Mirellys Jagan
(74) *Attorney, Agent, or Firm* — F. Chau & Associates, LLC

(57) ABSTRACT

A voltage-temperature sensor includes a first converter, a second converter and a data processing block. The first converter generates first digital data based on an operational voltage and an operational temperature. The first converter has a first sensitivity to the operational voltage and the operational temperature. The second converter generates second digital data based on the operational voltage and the operational temperature. The second converter has a second sensitivity to the operational voltage and the operational temperature. The second sensitivity is different from the first sensitivity. The data processing block determines a combination of an unknown value of the operational voltage and an unknown value of the operational temperature based on a combination of the first digital data and the second digital data.

19 Claims, 14 Drawing Sheets

FIG. 15

| TIME | CN1 | | | | CN2 | CN3 | CN4 | CN5 | CN6 | CN7 |
|---|---|---|---|---|---|---|---|---|---|---|
| | CN1[3] | CN1[2] | CN1[1] | CN1[0] | 0 | 0 | 0 | 0 | 0 | 0 |
| 0 | 0 | 0 | 0 | 0 | 0 | 0 | 0 | 0 | 0 | 0 |
| td | 0 | 0 | 0 | 1 | 0 | 0 | 0 | 0 | 0 | 0 |
| 2td | 0 | 0 | 0 | 1 | 1 | 0 | 0 | 0 | 0 | 0 |
| 3td | 0 | 0 | 0 | 1 | 1 | 1 | 0 | 0 | 0 | 0 |
| 4td | 0 | 0 | 0 | 1 | 1 | 1 | 1 | 0 | 0 | 0 |
| 5td | 0 | 0 | 0 | 1 | 1 | 1 | 1 | 1 | 0 | 0 |
| 6td | 0 | 0 | 0 | 1 | 1 | 1 | 1 | 1 | 1 | 0 |
| 7td | 0 | 0 | 0 | 1 | 1 | 1 | 1 | 1 | 1 | 1 |
| 8td | 0 | 0 | 1 | 0 | 1 | 1 | 1 | 1 | 1 | 1 |
| 9td | 0 | 0 | 1 | 0 | 0 | 1 | 1 | 1 | 1 | 1 |
| 10td | 0 | 0 | 1 | 0 | 0 | 0 | 1 | 1 | 1 | 1 |
| ⋮ | | | | | | | | | | |
| Ten-td | 1 | 1 | 0 | 0 | 1 | 1 | 0 | 0 | 0 | 0 |
| Ten | 1 | 1 | 0 | (1) | (1) | (1) | (1) | 0 | 0 | 0 |

CN1=13(decimal)

VOLTAGE-TEMPERATURE SENSOR AND SYSTEM INCLUDING THE SAME

CROSS-REFERENCE TO RELATED APPLICATIONS

This application claims priority under 35 USC §119 to Korean Patent Application No. 10-2011-0052701, filed on Jun. 1, 2011, the disclosure of which is incorporated by reference herein in its entirety.

TECHNICAL FIELD

Exemplary embodiments of the present invention relate to a semiconductor device, and more particularly, to a voltage-temperature sensor that dynamically measures a voltage and a temperature, and a system including the voltage-temperature sensor.

DISCUSSION OF RELATED ART

As the scale of integrated circuits based on the complementary metal-oxide-semiconductor (CMOS) process is decreased, on-chip variations in circuit design and chip debugging may occur. The on-chip variations may include, for example, static variations due to deviations in the manufacturing process, and dynamic variations depending on operational conditions of a circuit, such as an operational voltage and/or an operational temperature. Accurately measuring the operational voltage and the operational temperature may improve the ability to properly control a circuit having such on-chip variations.

SUMMARY

Exemplary embodiments of the present invention provide a voltage-temperature sensor for accurately measuring an operational voltage and an operational temperature dynamically.

Exemplary embodiments of the present invention provide a system including the voltage-temperature sensor to efficiently perform error debugging and/or real-time monitoring.

According to an exemplary embodiment, a voltage-temperature sensor includes a first converter, a second converter and a data processing block. The first converter generates first digital data depending on an operational voltage and an operational temperature. The first converter has a first sensitivity to the operational voltage and the operational temperature. The second converter generates second digital data depending on the operational voltage and the operational temperature. The second converter has a second sensitivity to the operational voltage and the operational temperature, and the second sensitivity is different from the first sensitivity. The data processing block extracts a combination of the operational voltage and the operational temperature based on a combination of the first digital data and the second digital data.

The first converter may be more sensitive to the operational voltage than to the operational temperature, and the second converter may be more sensitive to the operational temperature than the first converter.

Each of the first converter and the second converter may be a time-to-digital converter configured to generate each of detection signals having temporal characteristics depending on the operational voltage and the operational temperature, and configured to generate each of the first digital data and the second digital data based on the detection signals.

Each of the first converter and the second converter may include a ring oscillator and a digital quantifier. The ring oscillator may include a plurality of inverters having a first delay time corresponding to the first sensitivity or a second delay time corresponding to the second sensitivity. The digital quantifier may generate the first digital data or the second digital data based on output oscillating signals provided from nodes between the inverters.

Each inverter in the ring oscillator of the first converter may include one p-type metal oxide semiconductor (PMOS) transistor and one n-type metal oxide semiconductor (NMOS) transistor coupled between the operational voltage and a ground voltage, and each inverter in the ring oscillator of the second converter may include one PMOS transistor, one NMOS transistor and one diode-coupled NMOS transistor coupled between the operational voltage and the ground voltage.

The digital quantifier may include a plurality of counters configured to generate count signals corresponding to the first digital data or the second digital data based on the output oscillating signals.

In exemplary embodiments, one of the counters may generate a multi-bit count signal by counting edges of the corresponding output oscillating signal, and the rest of the counters may generate one-bit count signals such that each one-bit count signal transitions between a logic high level and a logic low level per edge of the corresponding output oscillating signal.

The ring oscillator may be enabled in response to a clock signal to perform a periodic oscillation per cycle of the clock signal.

The digital quantifier may output the first digital data or the second digital data periodically corresponding to the periodic oscillation of the ring oscillator.

The digital quantifier of the first converter may include a plurality of counting circuits configured to be sequentially enabled in response to a plurality of selection signals to sequentially output the first digital data corresponding to the periodic oscillation of the ring oscillator where the selection signals are sequentially activated per cycle of the clock signal.

The voltage-temperature sensor may further include a scan counter configured to store a value representing the operational timing of the first counter, a clock counter configured to count a cycle number of the clock signal, and a selection signal generator configured to compare outputs of the scan counter and the clock counter to generate the selection signals that are sequentially activated.

The data processing block may include a lookup table storing a plurality of combinations of the first digital data and the second digital data that are measured by varying combinations of the operational voltage and the operational temperature. The data processing block may refer to the lookup table to extract the combination of the operational voltage and the operational temperature corresponding to the combination of the first digital data and the second digital data.

The data processing block may store a function representing a relation between the combination of the operational voltage and the operational temperature and the combination of the first digital data and the second digital data. The data processing block may use the function to extract the combination of the operational voltage and the operational temperature corresponding to the combination of the first digital data and the second digital data.

A plurality of combinations of the first digital data and the second digital data may be measured by varying combinations of the operational voltage and the operational temperature, and the function may be determined using a least mean square method based on the measurement results.

According to exemplary embodiments of the present invention, a system includes a plurality of function blocks, a plurality of converters and a data processing block.

Each converter may be disposed adjacent to each function block and may generate first digital data and second digital data. The first digital data may vary with a first sensitivity to an operational voltage and an operational temperature of each function block, and the second digital data may vary with a second sensitivity to the operational voltage and the operational temperature of each function block, where the second sensitivity is different from the first sensitivity. The data processing block may extract a combination of the operational voltage and the operational temperature based on a combination of the first digital data and the second digital data.

At least two function blocks may operate based on different power supply voltages. The function blocks may include at least one of a clock generation circuit, a voltage regulator, a memory core, a processor and/or an interface circuit.

According to an exemplary embodiment, a voltage-temperature sensor includes a first converter, a second converter and a data processing block. The first converter is configured to generate first digital data based on an operational voltage and an operational temperature. The first converter has a first sensitivity to the operational voltage and the operational temperature. The second converter is configured to generate second digital data based on the operational voltage and the operational temperature. The second converter has a second sensitivity to the operational voltage and the operational temperature, and the second sensitivity is different from the first sensitivity. The data processing block is configured to determine a combination of an unknown value of the operational voltage and an unknown value of the operational temperature based on a combination of the first digital data and the second digital data.

According to an exemplary embodiment, a system includes a plurality of function blocks, a plurality of converters and a data processing block. Each converter is disposed near one of the plurality of function blocks and is configured to generate first digital data and second digital data. The first digital data varies with respect to a first sensitivity to an operational voltage and an operational temperature of a nearest function block, and the second digital data varies with respect to a second sensitivity to the operational voltage and the operational temperature of the nearest function block. The second sensitivity is different from the first sensitivity. The data processing block is configured to determine a combination of an unknown value of the operational voltage and an unknown value of the operational temperature based on a combination of the first digital data and the second digital data.

According to an exemplary embodiment, a method of measuring a voltage and a temperature includes setting an operational voltage and an operational temperature, and measuring first digital data and second digital data. The first and second digital data correspond to the operational voltage and the operational temperature, the first digital data is measured with respect to a first sensitivity to the operational voltage and the operational temperature, the second digital data is measured with respect to a second sensitivity to the operational voltage and the operational temperature, and the second sensitivity is different from the first sensitivity. The method further includes determining a combination of an unknown value of the operational voltage and an unknown value of the operational temperature based on a combination of the first digital data and the second digital data.

BRIEF DESCRIPTION OF THE DRAWINGS

The above and other features of the present invention will become more apparent by describing in detail exemplary embodiments thereof with reference to the accompanying drawings, in which:

FIG. 15 is a diagram illustrating an operation of the counting circuit of FIG. 9, according to an exemplary embodiment.

DETAILED DESCRIPTION OF THE EMBODIMENTS

Figure 1:
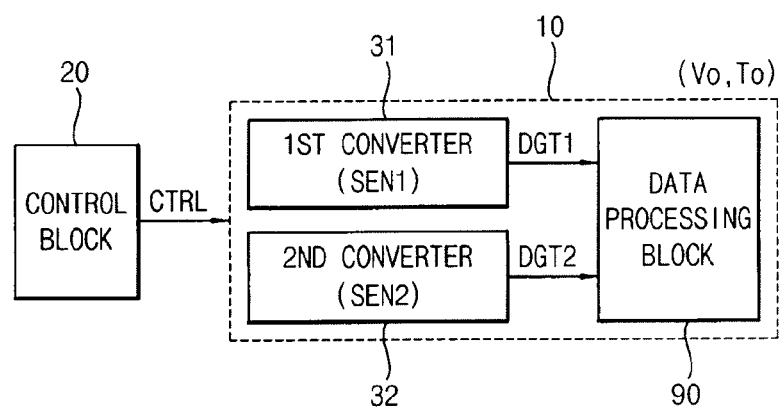
FIG. 1 is a block diagram illustrating a voltage-temperature sensor, according to an exemplary embodiment.

Exemplary embodiments of the present invention will be described more fully hereinafter with reference to the accompanying drawings. Like reference numerals may refer to like elements throughout the accompanying drawings.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element, or intervening elements may be present.

The terminology used herein is for the purpose of describing particular exemplary embodiments, and is not intended to be limiting of the present invention. As used herein, the singular foams "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a block diagram illustrating a voltage-temperature sensor, according to an exemplary embodiment.

Referring to FIG. 1, a voltage-temperature sensor 10 includes a first converter 31, a second converter 32 and a data processing block 90.

The first converter 31 has a first sensitivity SEN1 corresponding to an operational voltage Vo and an operational temperature To, and generates first digital data DGT1 based on the operational voltage Vo and the operational temperature To. The second converter 32 has a second sensitivity SEN2 corresponding to the operational voltage Vo and the operational temperature To. The second sensitivity SEN2 is different from the first sensitivity SEN1. The second converter 32 generates second digital data DGT2 based on the operational voltage Vo and the operational temperature To.

The data processing block 90 determines a combination (Vo, To) of the operational voltage Vo and the operational temperature To based on a combination (DGT1, DGT2) of the first digital data DGT1 and the second digital data DGT2. According to exemplary embodiments, the data processing block 90 may be implemented with hardware, software or a combination of hardware and software. For example, at least a portion of the data processing block 90 may be implemented in the form of program code that may be executed by a processor, and desired operations may be performed by executing the program code.

The voltage-temperature sensor 10 may control operational timings based on a control signal CTRL provided from a control block 20. For example, the control signal CTRL may include a signal provided from an external test device and/or a clock signal provided from a phase-locked loop. The phase-locked loop may be integrated together with the voltage-temperature sensor 10 in the same chip, or may be disposed in a separate chip. As will be described below, the control signal CTRL may include, for example, an enable signal EN, a reset signal RST, and/or a clock signal CLK.

The voltage variation is related to the temperature variation. According to exemplary embodiments of the present invention, the voltage-temperature sensor 10 is configured to measure the operational voltage and the operational temperature simultaneously. Simultaneously measuring the operational voltage and the operational temperature reflects the relation between the variations of the operational voltage and the operational temperature, and thus, at least one of the operational voltage and the operational temperature may be accurately determined.

The integration of the measurements of the operational voltage and the operational temperature may be performed by setting different sensitivities of the first converter 31 and the second converter 32. In an exemplary embodiment, the first converter 31 may be more sensitive to the operational voltage Vo than to the operational temperature To, and the second converter 32 may be more sensitive to the operational temperature To than to the first converter 31, as will be described with reference to FIGS. 5 and 6.

In exemplary embodiments of the present invention, the voltage-temperature sensor 10 may have a digital configuration that excludes, for example, on-chip analog components, off-chip resistors, and dedicated power lines. For example, the voltage-temperature sensor 10 may be implemented using a time-to-digital converter including a ring oscillator and a digital quantifier, as will be described with reference to FIG. 3.

Figure 2:
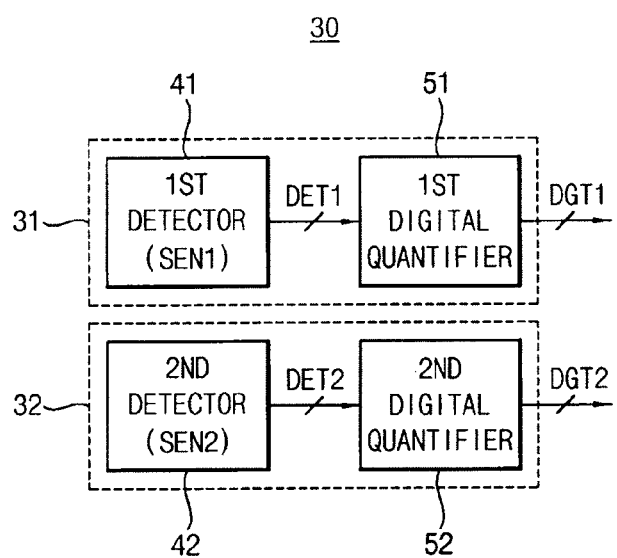
FIG. 2 is a block diagram illustrating an exemplary embodiment of converters in the voltage-temperature sensor of FIG. 1.

FIG. 2 is a block diagram illustrating an exemplary embodiment of converters in the voltage-temperature sensor of FIG. 1.

Referring to FIG. 2, a converter circuit 30 may include a first converter 31 and a second converter 32 shown in FIG. 1. Each of the first converter 31 and the second converter 32 may be, for example, a time-to-digital converter, which generates a first detection signal DET1 and a second detection signal DET2, respectively. The first detection signal DET1 and the second detection signal DET2 may have temporal characteristics based on the operational voltage Vo and the operational temperature To. For example, the temporal characteristics may be cyclic periods of the oscillating detection signal DET1 and DET2. Each of the first converter 31 and the second converter 32 may further generate the first digital data DGT1 and the second digital data DGT2 based on the detection signals DET1 and DET2, respectively.

The first converter 31 may be, for example, a time-to-digital converter including a first detector 41 and a first digital quantifier 51, and the second converter 32 may be, for example, a time-to-digital converter including a second detector 42 and a second digital quantifier 52. The first detector 41 and the second detector 42 may respectively have the first sensitivity SEN1 and the second sensitivity SEN2 to the operational voltage Vo and the operational temperature To. The oscillation periods or cyclic periods of the first and second detectors 41 and 42 may be different when the first and second sensitivities SEN1 and SEN2 are different.

As such, the first and second converters 31 and 32 may be implemented with time-to-digital converters having a digital configuration, as described with reference to FIG. 2, resulting in the ability to efficiently design and test the integrated circuits.

Figure 3:
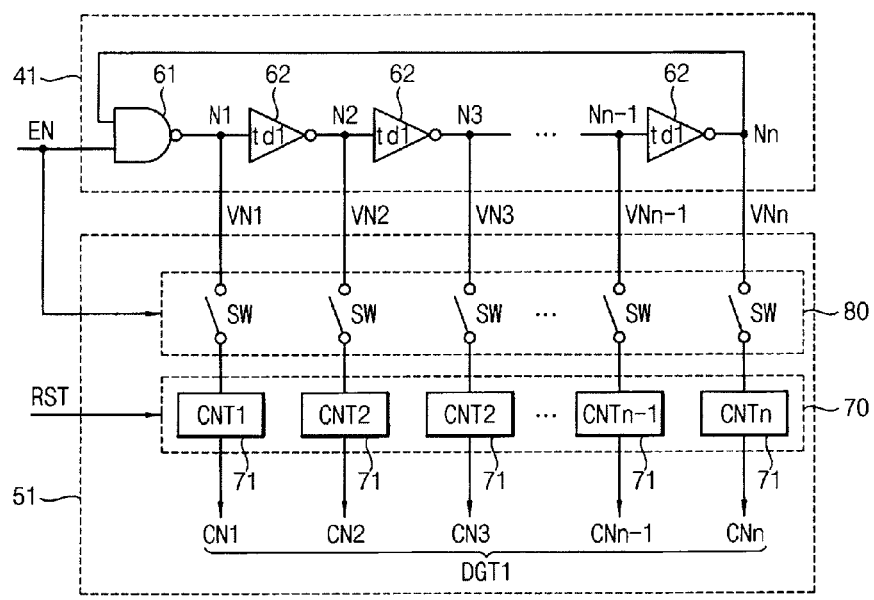
FIG. 3 is a circuit diagram illustrating the first converter of FIG. 2 embodied as a time-to-digital converter, according to an exemplary embodiment.

FIG. 3 is a circuit diagram illustrating the first converter 31 of FIG. 2 embodied as a time-to-digital converter, according to an exemplary embodiment.

FIG. 3 refers to the first converter 31 in FIG. 2 for convenience of description. The second converter 32 in FIG. 2 may have a configuration similar to the configuration shown in FIG. 3.

Referring to FIG. 3, the first converter 31 includes a first detector 41 and a first digital quantifier 51. The first detector 41 may be implemented using, for example, a ring oscillator including a plurality of inverters 62 having substantially the same delay time. Each inverter 62 may have, for example, a first delay time td1 corresponding to the above-mentioned first sensitivity SEN1. The first detector 41 may further include a NAND gate 61 that receives an enable signal EN and an n-th output oscillating signal VNn provided from the last inverter, and outputs a first output oscillating signal VN1 as an input to the first inverter. The NAND gate 61 may have the same delay time as the first delay time td1 of each inverter 62. The enable signal EN may be included in the control signal CTRL provided from the control block 20 in FIG. 1, and the ring oscillator may be enabled in response to the enable signal EN.

As such, the delay elements 61 and 62 having a predetermined delay time may form a loop, and the output oscillating signals VN1 through VNn provided from nodes N1 through Nn between the inverters 62 may have a phase difference corresponding to the first delay time td1, and the same oscillation period. The operation of the ring oscillator will be further described with reference to FIG. 4.

The first digital quantifier 51 generates the first digital data DGT1 based on the output oscillating signals VN1 through VNn provided from the nodes N1 through Nn. The first digital quantifier 51 may include, for example, a switch unit 80 and a counting circuit 70. The switch unit 80 may include, for example, a plurality of switches SW that control electrical connections between the counting circuit 70 and the respective nodes N1 through Nn of the ring oscillator. For example, the switch unit 80 may perform an on-off operation in response to the enable signal EN that controls the operational timing of the ring oscillator. The counting circuit 70 may include, for example, a plurality of counters 71 configured to generate count signals CN1 through CNn corresponding to the first digital data DGT1 based on the output oscillating signals VN1 through VNn. The counters 71 may have the same configuration as each other, or at least one counter may have a different configuration from the other counters, as will be described with reference to FIG. 9. The counting circuit 70 may be initialized in response to a reset signal RST. The reset signal may be included in the control signal CTRL provided from the control block 20 in FIG. 1. The count signals CN1 through CNn may be provided as the first digital data DGT1, or the result of a further calculation based on the count signals CN1 through CNn may be provided as the first digital data DGT1.

The second converter 32 in FIG. 2 may have a configuration similar to the first converter 31 as shown in FIG. 3. In an exemplary embodiment, the first detector 41 in the first converter 31 includes the inverters 62 having the first delay time td1 corresponding to the first sensitivity SEN1, and the second detector 42 in the second converter 32 includes inverters having a second delay time td2 corresponding to the second sensitivity SEN2. Thus, the different sensitivities SEN1 and SEN2 to the operational voltage Vo and the operational temperature To may be represented by the different delay times td1 and td2 of the inverters forming the first detector 41 and the second detector 42. An exemplary embodiment including inverters having the different delay times will be described with reference to FIGS. 5 and 6.

According to exemplary embodiments, the voltage-temperature sensor 10 may have a digital configuration using a time-digital converter for the first converter 31 of FIG. 3, and may exclude on-chip analog components such as, for example, amplifiers, analog-to-digital converters, off-chip resistors, dedicated power lines, etc. As a result, the area of the voltage-temperature sensor 10 occupied by components may be decreased, the operational voltage and the operational temperature may be accurately measured, and the performance of devices and/or systems including the voltage-temperature sensor 10 may be improved.

Figure 4:
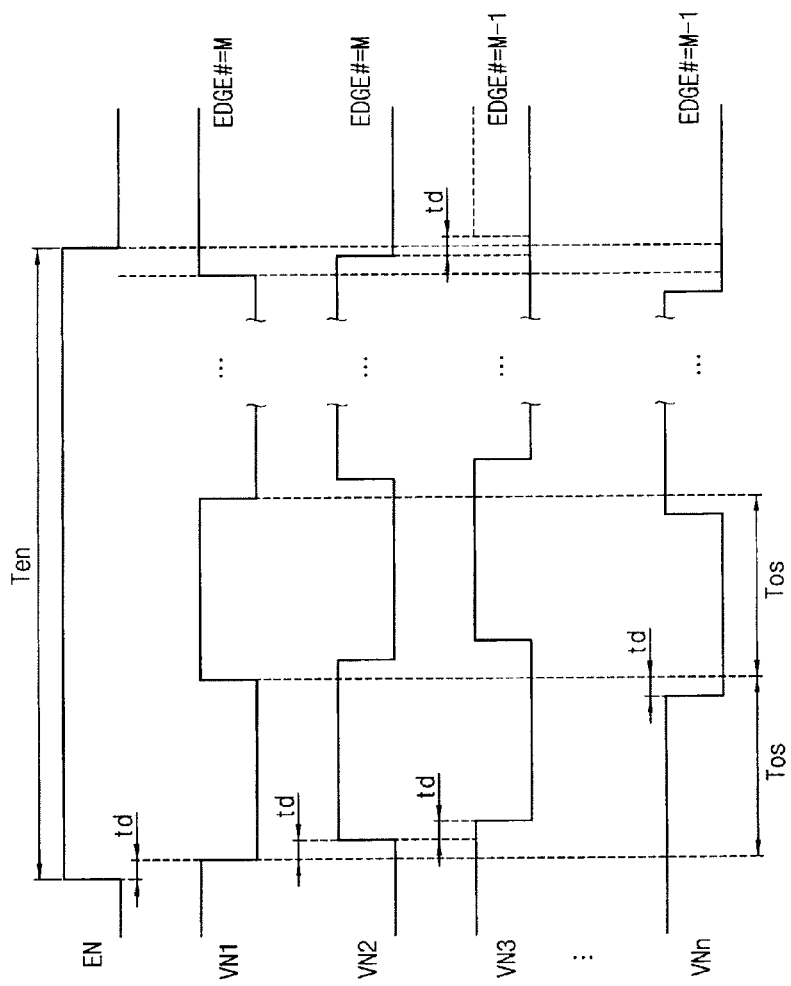
FIG. 4 is a timing diagram illustrating an operation of the ring oscillator in the voltage-temperature sensor of FIG. 4, according to an exemplary embodiment.

FIG. 4 is a timing diagram illustrating an operation of the ring oscillator in the voltage-temperature sensor of FIG. 4, according to an exemplary embodiment.

Referring to FIGS. 3 and 4, the ring oscillator may operate in an idle mode while the enable signal EN has a logic low level, and in an oscillation mode while the enable signal EN has a logic high level. During the idle mode, the NAND gate 61 outputs the first output oscillating signal VN1, which has a logic high level regardless of the logic level of the n-th output oscillating signal VNn. Accordingly, all of the output oscillating signals VN1 through VNn maintain one of a logic high level and a logic low level during the idle mode. The first output oscillating signal VN1 transitions from a logic high level to a logic low level after the delay time td1 has elapsed. Delay time td1 corresponds to the enable signal EN transitioning from a logic low level to a logic high level. The second output oscillating signal VN2 transitions from a logic low level to a logic high level after another delay time td has elapsed. As such, the output oscillating signals VN1 through VNn transition sequentially by the delay time td, and a rising edge and a falling edge are repeated. When n inverters 62 are included in the ring oscillator, each output oscillating signal repeats a rising edge and a falling edge per time Tos, which corresponds to n*td. That is, each output oscillating signal has an oscillation period of 2*Tos. When the enable signal EN is deactivated (e.g., the enable signal EN transitions from a logic high level to a logic low level), the output oscillating signals VN1 through VNn stop oscillating, and the respective logic levels are maintained at the time of deactivation.

The delay time td illustrated in FIG. 4 corresponds to the first delay time td1 for the first converter 31, and the second delay time td2, which is different from the first delay time td1, for the second converter 32. As described above, the first delay time td1 and the second delay time td2 may represent the first sensitivity SEN1 and the second sensitivity SEN2, respectively.

The counters CNT1 through CNTn in the counting circuit 70 output the count signals CN1 through CNn, respectively, by counting the edges of the output oscillating signals VN1 through VNn during the activation time interval Ten of the enable signal EN. For example, if the enable signal EN is deactivated after the second oscillating signal VN2 has transitioned and before the delay time td has elapsed, the first and second count signals CN1 and CN2 have the same count number (e.g., M), and count signals CN3 through CNn have the same count number (e.g., M−1).

The delay time td may be measured based on the count signals CN1 through CNn representing the edge numbers during the activation time interval Ten of the enable signal EN. The delay time td may be calculated as Ten/Nt, where Nt indicates the total edge numbers of the output oscillating signals VN1 through VNn during the time interval Ten. For example, the delay time td may be a certain value between Ten/(Nt+1) and Ten/Nt, and may be approximated to Ten/Nt. More precise values of the delay time td may be measured as the activation time interval Ten is increased. The operational voltage Vo and the operational temperature To may be obtained by measuring the respective delay times td1 and td2 using two ring oscillators having different sensitivities SEN1 and SEN2 to the operational voltage Vo and the operational temperature To.

Figure 5:
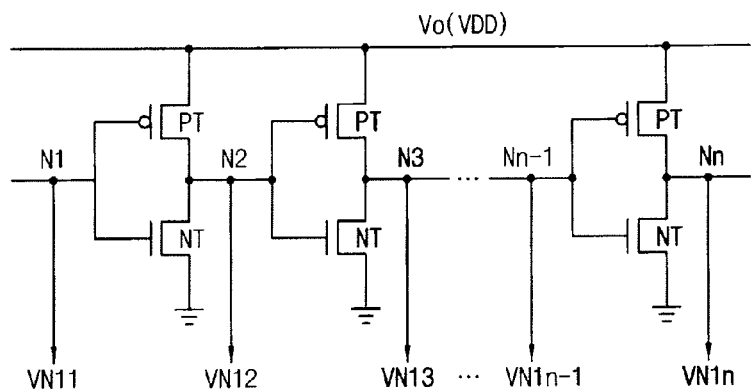
FIGS. 5 and 6 are circuit diagrams illustrating exemplary embodiments of the inverter chain in the ring oscillator in FIG. 3.
Figure 6:
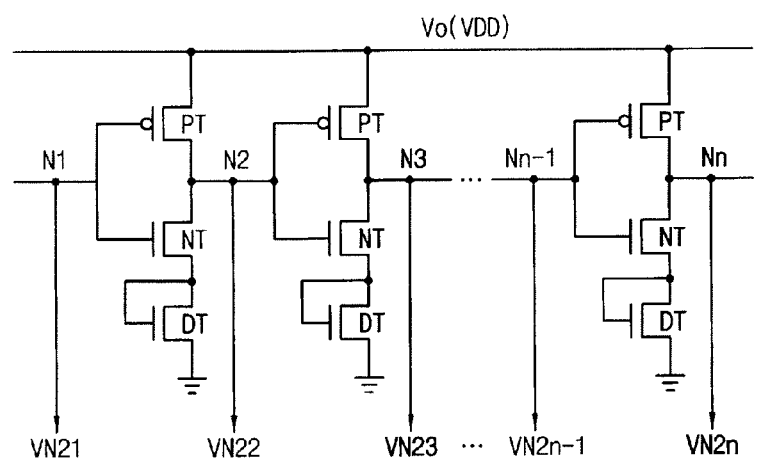

FIGS. 5 and 6 are circuit diagrams illustrating exemplary embodiments of the inverter chain in the ring oscillator in FIG. 3.

Referring to FIG. 5, the inverter chain 63 may be implemented, for example, using an inverter including one p-type metal oxide semiconductor (PMOS) transistor PT and one n-type metal oxide semiconductor (NMOS) transistor NT coupled between the operational voltage Vo and a ground voltage. For example, the operational voltage Vo may be a power supply voltage VDD of a device or a system including the voltage-temperature sensor 10. The inverter may have an operational speed that is relatively less sensitive to the operational temperature To than to the operational voltage Vo.

Referring to FIG. 6, the inverter chain 64 may be implemented, for example, using a small-swing inverter including one PMOS transistor PT, one NMOS transistor NT and one diode-coupled NMOS transistor DT coupled between the operational voltage Vo and the ground voltage. The small-swing inverter may have an operational speed that is sensitive to the operational voltage Vo, and, due to the small swing range, more sensitive to the operational temperature To than the inverter of FIG. 5.

Referring to the inverter chains 63 and 64 of FIGS. 5 and 6, the inverter chain 63 of FIG. 5 is relatively sensitive to the operational voltage Vo, and the inverter chain 64 of FIG. 6 is relatively sensitive to the operational temperature To. That is, the output oscillating signals VN1 through VNn may be relatively sensitive to the operational voltage Vo if the inverter chain 63 of FIG. 5 is included in the ring-oscillator, and the output oscillating signals VN1 through VNn may be relatively sensitive to the operational temperature To if the inverter chain 64 of FIG. 6 is included in the ring-oscillator.

For example, the first detector 41 in the first converter 31 may include the inverter chain 63 of FIG. 5, and the second detector 42 in the second converter 32 may include the inverter chain 64 of FIG. 6. In this case, the first converter 31 may be more sensitive to the operational voltage Vo than to the operational temperature To, and the second converter 32 may be more sensitive to the operational temperature To than the first converter 31. As such, the combination (DGT1, DGT2) of the digital data DGT1 and DGT2 may be obtained using the two converters 31 and 32 having different sensitivities SEN1 and SEN2, and the combination (Vo, To) of the operational voltage Vo and the operational temperature To may be accurately determined based on the combination (DGT1, DGT2) of the digital data DGT1 and DGT2.

Figure 7:
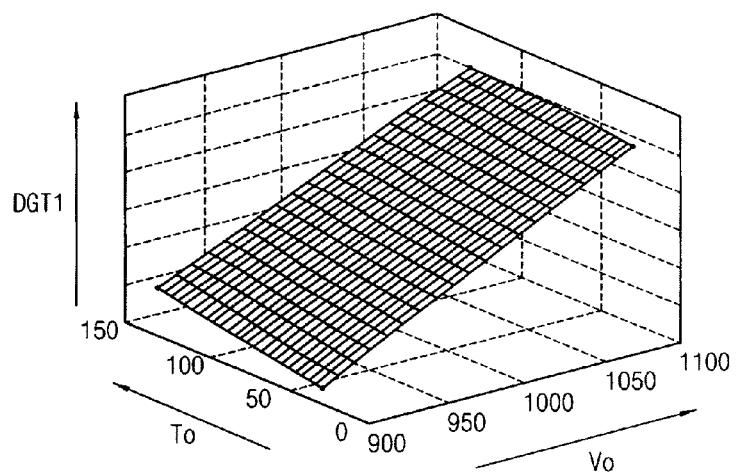
FIGS. 7 and 8 are diagrams illustrating operational characteristics of the first converter and the second converter in the voltage-temperature sensor of FIG. 1, according to exemplary embodiments.
Figure 8:
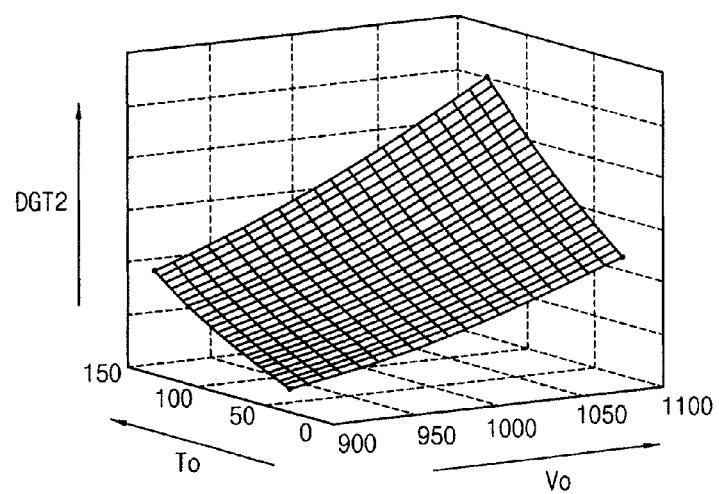

FIGS. 7 and 8 are diagrams illustrating operational characteristics of the first converter and the second converter in the voltage-temperature sensor of FIG. 1, according to exemplary embodiments.

FIGS. 7 and 8 are three-dimensional graphs representing values of the first digital data DGT1 and the second digital data DGT2 with respect to the various combinations of the operational voltage Vo and the operational temperature To, which are measured using two time-digital converters having different sensitivities to the operational voltage Vo and the operational temperature To.

FIG. 7 shows the operational characteristic of the first converter 31 embodied as a time-digital converter, which is relatively sensitive to the operational voltage Vo. FIG. 8 shows the operational characteristic of the second converter 32 embodied as a time-digital converter, which is relatively sensitive to the operational temperature To. As described above, the first converter 31 may include a ring oscillator using the inverter chain 63 of FIG. 5, and the second converter 32 may include a ring oscillator using the inverter chain 64 of FIG. 6.

As illustrated in FIGS. 7 and 8, the first converter 31, which is relatively sensitive to the operational voltage Vo, shows less variation with respect to the operational temperature To than the second converter 32, which is relatively sensitive to the operational temperature To. As will be described with reference to FIG. 19, a plurality of the combinations (DGT1, DGT2) of the first digital data DGT1 and the second digital data DGT2 may be measured in advance with respect to the various combinations (Vo, To) of the operational voltage Vo and the operational temperature To. An unknown voltage and temperature may then be determined based on the mapping relations between the combinations (DGT1, DGT2) and (Vo, To).

Figure 9:
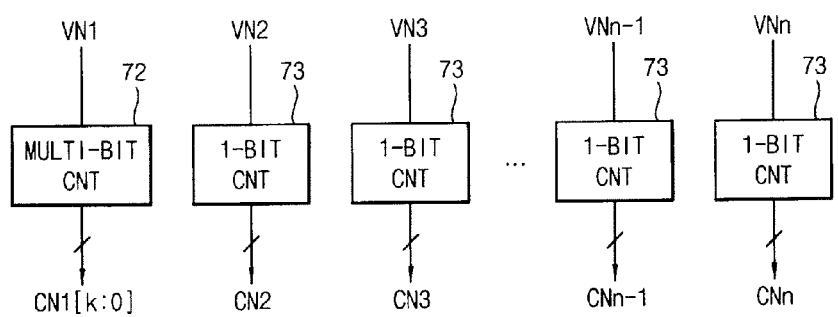
FIG. 9 is a diagram illustrating an exemplary embodiment of the counting circuit in the time-to-digital converter described with reference to FIG. 3, according to an exemplary embodiment.

FIG. 9 is a diagram illustrating an exemplary embodiment of the counting circuit in the time-to-digital converter described with reference to FIG. 3, according to an exemplary embodiment.

As described with reference to FIGS. 2 and 3, the first digital quantifier 51 in the first converter 31 and the second digital quantifier 52 in the second converter 32 may include a plurality of counters CNT1 through CNTn, which output the count signals CN1 through CNn corresponding to the first digital data DGT1 and the second digital data DGT2, respectively.

In exemplary embodiments, one of the counters (e.g., CNT1) may generate a multi-bit count signal by counting the edges of the corresponding output oscillating signal, and the other counters (e.g., CNT2 through CNTn) may generate one-bit count signals such that each one-bit count signal transitions between a logic high level and a logic low level per edge of the corresponding output oscillating signal.

For example, as illustrated in FIG. 9, the first counter 72 in the counting circuit 70 may be a multi-bit counter that outputs the first count signal CN1 [k:0] of multiple bits, and the other counters 73 may be one-bit counters that output the count signals CN2 through CNn, toggling in response to each edge of the respective output oscillating signals VN2 through VNn. The calculation of the total number of edges based on the count signals CN1[k:0], CN2 through CNn will be described with reference to FIG. 15.

Figure 10:
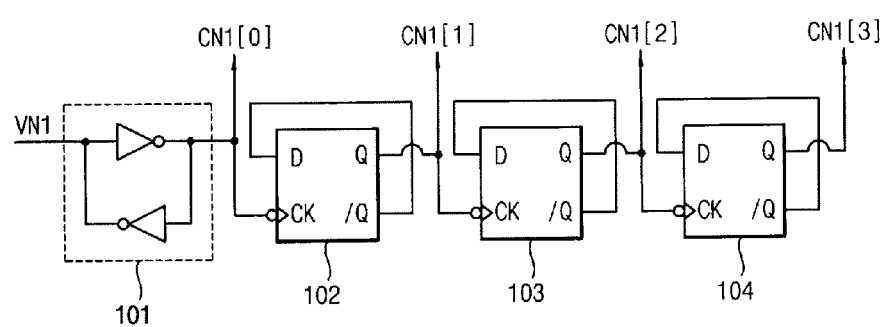
FIG. 10 is a diagram illustrating an exemplary embodiment of the multi-bit counter in the counting circuit of FIG. 9.

FIG. 10 is a diagram illustrating an exemplary embodiment of the multi-bit counter in the counting circuit of FIG. 9.

Referring to FIG. 10, the multi-bit counter 72 may include a latch 101 and a plurality of D flip-flops 102, 103 and 104. The number of D flip-flops may be varied according to the bit numbers of the first count signal CN1.

The latch 101 latches the first output oscillating signal VN1 and outputs an inversion signal as a first bit signal CN1 [0] of the first count signal CN1. The D flip-flops 102, 103 and 104 may be implemented using, for example, negative-edge triggered D flip-flops that generate a second bit signal CN[1], a third bit signal CN[2] and a fourth bit signal CN[3] of the first count signal CN1, which are sequentially toggled. Referring to the negative-edge triggered D flip-flops, the non-inversion output terminal Q of the previous stage is coupled to the clock terminal CK of the next stage, and inversion output terminal /Q of each stage is coupled to the data terminal D of the same stage.

Figure 11:
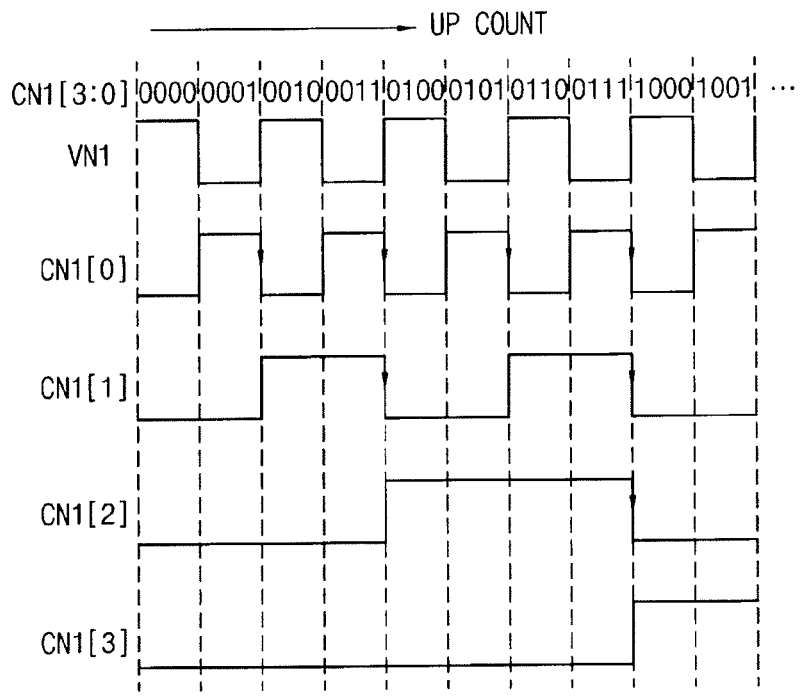
FIG. 11 is a timing diagram illustrating an operation of the multi-bit counter of FIG. 10, according to an exemplary embodiment.

FIG. 11 is a timing diagram illustrating an operation of the multi-bit counter of FIG. 10, according to an exemplary embodiment.

Referring to FIGS. 10 and 11, the latch 101 latches the first output oscillating signal VN1 and outputs the inversion signal as the first bit signal CN1[0]. The second bit signal CN1[1], the third bit signal CN1[2] and the fourth bit signal CN1[3] from the negative-edge triggered D flip-flops 102, 103 and 104 toggle in response to the falling edges of the output of the previous stage. That is, the second bit signal CN1[1] toggles in response to the falling edges of the first bit signal CN1 [0], the third bit signal CN1 [2] toggles in response to the falling edges of the second bit signal CN1[1], and the fourth bit signal CN1[3] toggles in response to the falling edges of the third bit signal CN1[2]. As a result, the second, third and fourth bit signals CN1[1], CN1[2] and CN1[3] have respective cyclic periods that are sequentially doubled as illustrated in FIG. 11, and represent the three most significant bits of the first count signal CN1[3:0]. Referring to the values of the first count signal CN1[3:0] shown above the first output oscillating signal VN1 in FIG. 11, the first count signal CN1[3:0] increases from 0000, to 0001, to 0010, to 0011, indicating that up-counting is performed.

Figure 12:
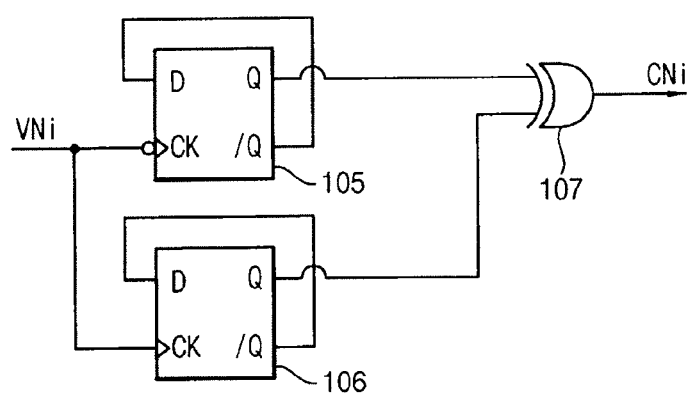
FIG. 12 is a diagram illustrating an exemplary embodiment of the one-bit counter in the counting circuit of FIG. 9.

FIG. 12 is a diagram illustrating an exemplary embodiment of the one-bit counter in the counting circuit of FIG. 9.

Referring to FIG. 12, the one-bit counter 73 may include, for example, a negative-edge triggered D flip-flop 105, a positive-edge triggered D flip-flop 106 and an XOR gate 107. The negative-edge triggered D flip-flop 105 outputs a first signal toggling between a logic high level and a logic low level at every falling edge of the output oscillating signal VNi, and the positive-edge triggered D flip-flop 106 outputs a second signal toggling between a logic high level and a logic low level at every rising edge of the output oscillating signal VNi. The one-bit count signal CNi output by the XOR gate 107 has a logic low level when both the first and second signals have a logic high level or a logic low level, and has a logic high level when the logic levels of the first and second signals are different. Accordingly, the one-bit counter 73 may output the one-bit count signal CNi toggling at every rising and falling edge of the output oscillating signal VNi.

Figure 13:
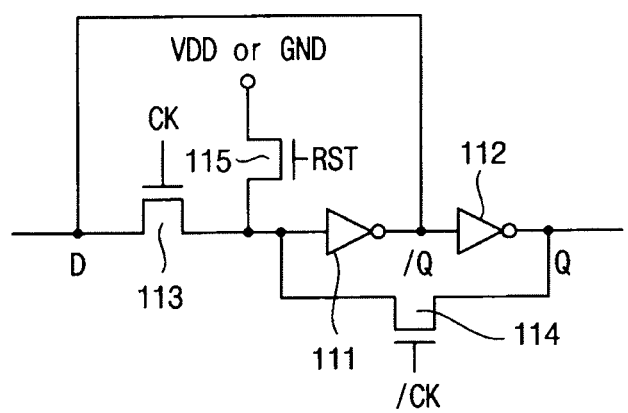
FIGS. 13 and 14 are diagrams illustrating exemplary embodiments of the flip-flops in the counters of FIGS. 10 and 12.
Figure 14:
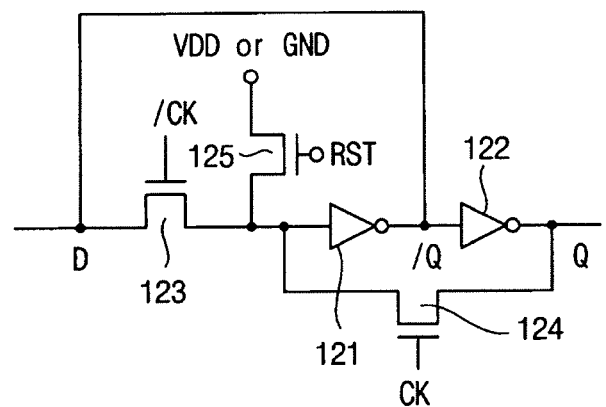

FIGS. 13 and 14 are diagrams illustrating exemplary embodiments of the flip-flops in the counters of FIGS. 10 and 12.

FIG. 13 illustrates an exemplary embodiment of a positive-edge triggered D flip-flop 105, and FIG. 14 illustrates an exemplary embodiment of a negative-edge triggered D flip-flop 106. The configurations of the flip-flops in FIGS. 13 and 14 are exemplary embodiments presented for describing the toggling operation of the D flip-flops in the counters 72 and 73 of FIGS. 10 and 12, and the configuration of the D flip-flops is not limited thereto.

Referring to FIG. 13, the positive-edge triggered D flip-flop 105 may include a first inverter 111, a second inverter 112, a first switch 113 and a second switch 114.

The output of the first inverter 111 is coupled to the input of the second inverter 112, and the output of the second inverter 112 is coupled to the input of the first inverter 111 via the second switch 114, thereby forming a latch configuration. In FIG. 13, the output of the first inverter 111 corresponds to an inversion output terminal /Q, and the output of the second inverter 112 corresponds to a non-inversion output terminal Q. The first switch 113 is coupled between a data terminal D and the input of the first inverter 111, and the control terminal CK of the first switch 113 corresponds to a clock terminal. A clock signal CLK is applied to the control terminal CK of the first switch 113, and an inversion signal /CLK of the clock signal CLK is applied to the control terminal /CK of the second switch 114.

The positive-edge triggered D flip-flop 105 of FIG. 13 may further include a reset switch 115 that initializes a state of the flip-flop 105. When the reset switch 115 is turned on in response to a reset signal RST, the inversion output terminal /Q and the output terminal Q may be initialized respectively to a logic low level or a logic high level depending on whether the voltage at the reset switch 115 is the reset voltage VDD or GND. The reset signal RST may be included in the control signal CTRL provided from the control block 20 of FIG. 1.

When the clock signal CLK applied to the control terminal CK has a logic low level, the D flip-flop 105 of FIG. 13 is in a storage state that does not change even though the logic level of the data terminal D is changed. When the clock signal CLK transitions from a logic low level to a logic high level (e.g., the rising edge of the clock signal CLK), the logic level of the data terminal D is transferred to the non-inversion output terminal Q. A D flip-flop having a logic state that is determined in synchronization with the edge of the signal applied to the clock terminal CK is referred to as an edge triggered D flip-flop, and the D flip-flop 105 of FIG. 13 is a positive-edge triggered D flip-flop.

The positive-edge triggered D flip-flop 105 may perform toggling when the inversion output terminal /Q is coupled to the data terminal D. When the clock signal CLK applied to the control terminal CK transitions to a logic low level, the second switch 114 is turned on and the data terminal D is set to the logic level opposite the non-inversion output terminal Q. In this case, the state of the D flip-flop 105 is not changed since the first switch 113 is turned off. When the clock signal CLK transitions to a logic high level, the first switch 113 is turned on and the logic level of the inversion output terminal /Q is applied to the input of the first inverter 111, thereby inverting the logic state of the non-inverting output terminal Q. As such, the positive-edge triggered D flip-flop 105 performs toggling by inverting the storage state from a logic high level to a logic low level, or from a logic low level to a logic high level at each rising edge of the clock signal CLK applied to the control terminal CK.

Referring to FIG. 14, the negative-edge triggered D flip-flop 106 has a configuration similar to the positive-edge triggered D flip-flop 105 of FIG. 13, except the inversion signal /CLK of the clock signal CLK is applied to the control gate /CK of the first switch 123, and the clock signal CLK is applied to the control gate CK of the second switch 124.

The negative-edge triggered D flip-flop 106 of FIG. 14 performs toggling in response to the falling edges of the clock signal CLK, whereas the positive-edge triggered D flip-flop 105 of FIG. 13 performs toggling in response to the rising edges of the clock signal CLK. The D flip-flop 106 of FIG. 14 may include first and second switches 123 and 124 similar to the first and second switches 113 and 114 in the D flip-flop 105 of FIG. 13, first and second inverters 121 and 122 similar to the first and second inverters 111 and 112 in the D flip-flop 105 of FIG. 13, and a reset switch 125 similar to the reset switch 115 in the D flip-flop 105 of FIG. 13. When the clock signal CLK applied to the control terminal CK transitions to a logic high level, the second switch 124 is turned on and the data terminal D is set to the logic level opposite the non-inversion output terminal Q. In this case, the state of the flip-flop is not changed since the first switch 123 is turned off. When the clock signal CLK transitions to a logic low level, the first switch 123 is turned on and the logic level of the inversion output terminal is applied to the input of the first inverter 121, thereby inverting the logic state of the non-inverting output terminal Q. As such, the negative-edge triggered D flip-flop 106 performs toggling by inverting the storage state from a logic high level to a logic low level, or from a logic low level to a logic high level at each falling edge of the clock signal CLK applied to the control terminal CK.

In exemplary embodiments, the multi-bit counter 72 and the one-bit counter 73 may be implemented using positive-edge triggered D flip-flops 105 and/or negative-edge triggered D flip-flops 106 as described in FIGS. 13 and 14.

FIG. 15 is a diagram illustrating an operation of the counting circuit of FIG. 9, according to an exemplary embodiment.

Referring to FIG. 15, the first count signal CN1 is a multi-bit signal including the first bit signal CN1[0], the second bit signal CN1[1], the third bit signal CN1[2] and the fourth bit signal CN1[3]. The second through seventh count signals CN2 through CN7 are one-bit signals. The number of the count signals and bit number of the first count signal CN1 are not limited to the embodiment shown in FIG. 15, and may be variously changed according to the configuration of the counting circuit 70.

At time 0, all of the count signals CN1 through CN7 have a logic low level (e.g., 0), which indicates that the counting circuit 70 is initialized in the idle mode, and the enable signal EN is deactivated (e.g., the enable signal EN has a logic low level).

The delay time of each inverter in the ring oscillator is represented by td. At time td, the first output oscillating signal VN1 transitions and the first count signal CN1 is increased from 0000 to 0001. At time 2td, the second output oscillating signal VN2 transitions and the second count signal CN2 toggles from 0 to 1. As such, the one-bit count signals CN2 through CN7 toggle sequentially based on the time interval td. At time 7td, the last one-bit count signal CN7 toggles from 0 to 1, and at time 8td, the first count signal CN1 is increased from 0001 to 0010. As such, the first count signal CN1 counts the total number of edges of the first output oscillating signal VN1, and each one-bit count signal CNi (i=1, 2, ..., 7) transitions between a logic high level and a logic low level at every edge of the corresponding output oscillating signal VNi.

At time Ten when the enable signal EN is deactivated, all of the count signals CN1 through CN7 stop toggling and maintain their respective values. The total number of the edges in all of the output oscillating signals VN1 through VN7 during the activation time interval Ten of the enable signal EN may be calculated based on the last value of the count signals CN1 through CN7. For example, in FIG. 15, the first count signal CN1 indicates that the edge number of the first output oscillating signal VN1 is 13, and it may be determined that the oscillation was finished after the fourth count signal CN4 toggled and before the fifth count signal CN5 toggled, because the values of the fourth and fifth count signals CN4 and CN5 are different from each other. The total number Nt of the edges of all the output oscillating signals VN1 through VN7 may be calculated approximately as Nt=(13−1)*7+4=88. The delay time td of each inverter in the ring oscillator may be calculated as td=Ten/Nt.

Figure 16A:
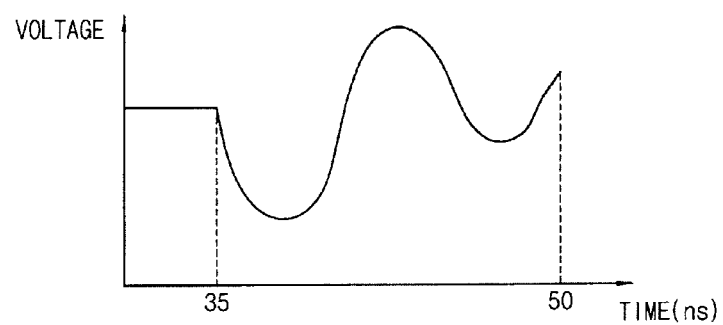
FIGS. 16A and 16B are diagrams illustrating a method of measuring a voltage, according to exemplary embodiments.
Figure 16B:
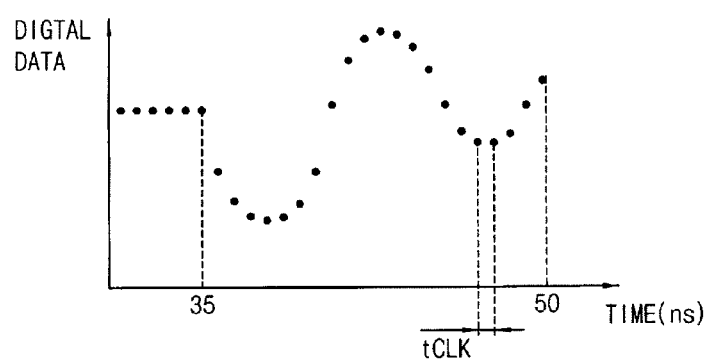

FIGS. 16A and 16B are diagrams illustrating a method of measuring a voltage, according to exemplary embodiments.

As described above, the time-to-digital converters according to exemplary embodiments may generate the first digital data DGT1 corresponding to the first sensitivity SEN1, and the second digital data DGT2 corresponding to the second sensitivity SEN2, by counting the oscillating signals during the activation time interval Ten of the enable signal EN. When the operational voltage Vo and/or the operational temperature To are varied rapidly, the sampling period of the digital data DGT1 and DGT2 is shortened. In exemplary embodiments, a clock signal CLK having a relatively high frequency may be used as the enable signal EN applied to the first converter 41 embodied as a ring oscillator as shown in FIG. 3. In this case, the ring oscillator may perform a periodical oscillation per cycle of the clock signal CLK. The first digital quantifier 51 may output the first digital data DGT1 periodically corresponding to the periodic oscillation of the ring oscillator.

FIGS. 16A and 16B illustrate exemplary embodiments having the clock signal CLK used as the enable signal EN to track the operational voltage Vo, which may vary rapidly. FIG. 16A represents the waveform of the operational voltage Vo to be measured, and FIG. 16B represents the reconstructed waveform of the operational voltage Vo by sampling the digital data per cyclic period tCLK of the clock signal CLK. As seen in FIGS. 16A and 16B, the voltage-temperature sensor 10 according to exemplary embodiments may successfully reconstruct the waveform of a rapidly varying voltage.

Figure 17:
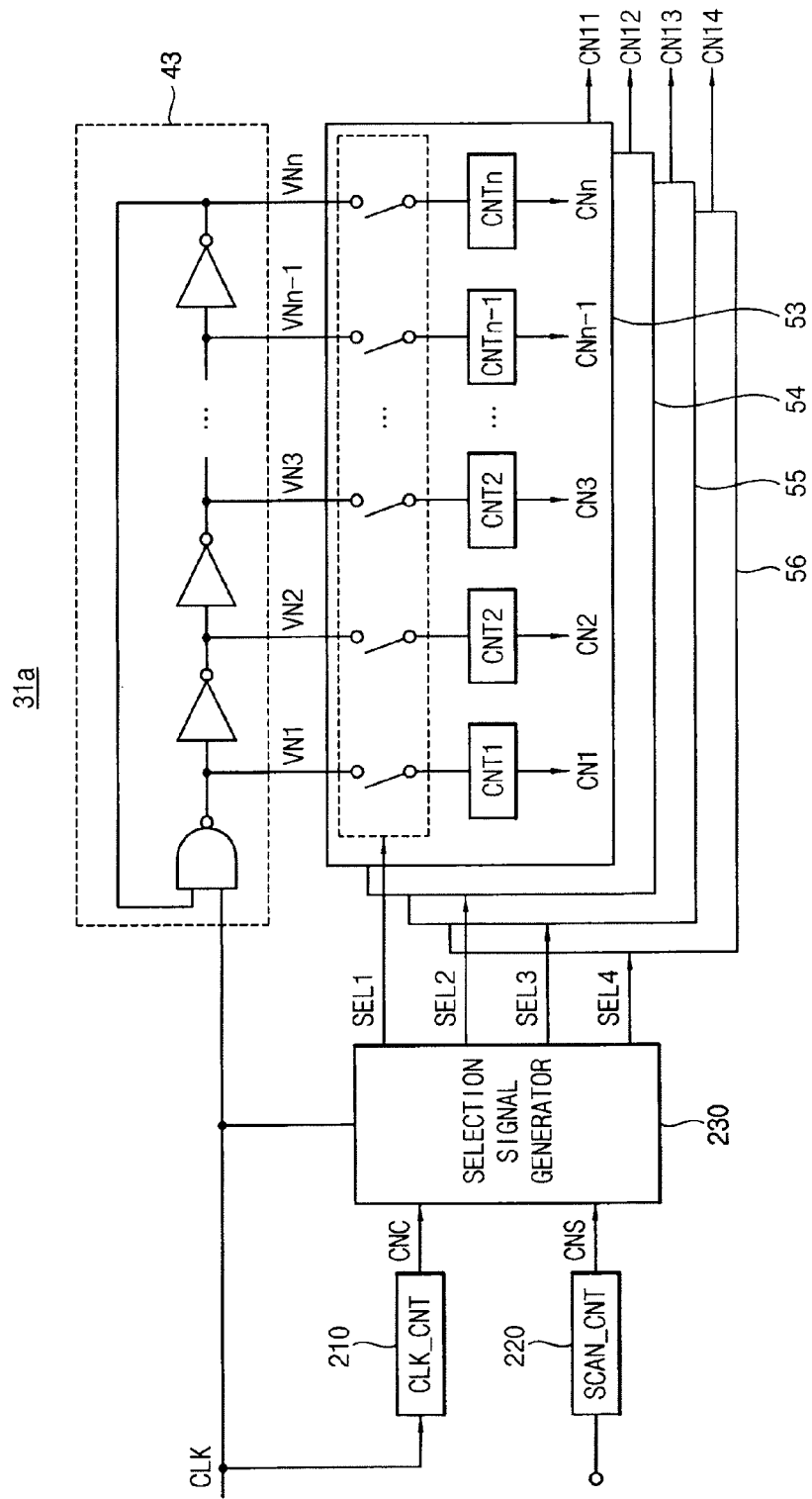
FIG. 17 is a circuit diagram illustrating a time-to-digital converter, according to exemplary embodiments.

FIG. 17 is a circuit diagram illustrating a time-to-digital converter, according to exemplary embodiments. Certain elements in FIG. 17 are similar to elements described with reference to FIG. 3. A further description of such elements may be omitted.

The time-to-digital converter 31a of FIG. 17 may be used to measure a rapidly varying operational voltage. For example, the on-chip power supply voltage may have a noise component ranged in a few hundred MHz. In this case, the sampling rate of at least a few GHz may be used to measure the noise component. Real-time streaming of the digital data may be complex due to the restricted speed of the input-output interface of the chip. To stream the digital data in real-time, a plurality of counting circuits 53, 54, 55 and 56 may be coupled in parallel to a first detector 43. In an exemplary embodiment, the first detector 43 may be a ring oscillator. The counting circuits 53, 54, 55 and 56 may be sequentially enabled in response to a plurality of selection signals SEL1, SEL2, SEL3 and SEL4, and may sequentially output the first digital data CN11, CN12, CN13 and CN14 corresponding to the periodic oscillation of the ring oscillator. The selection signals SEL1, SEL2, SEL3 and SEL4 are sequentially activated per cyclic period tCLK of the clock signal CLK.

The time-to-digital converter 31a of FIG. 17 may further include a clock counter 210, a scan counter 220 and a selection signal generator 230 that generates the selection signals SEL1, SEL2, SEL3 and SEL4. The selection signals SEL1, SEL2, SEL3 and SEL4 may be sequentially activated.

The scan counter 220 stores a value representing the operational timing of the first converter 31a (e.g., the time-to-digital converter), and the clock counter 210 counts a cycle number of the clock signal CLK. The selection signal generator 230 compares output CNS of the scan counter 220 and output CNC of the clock counter 210, and generates the selection signals SEL1, SEL2, SEL3 and SEL4, which may be sequentially activated.

Figure 18:
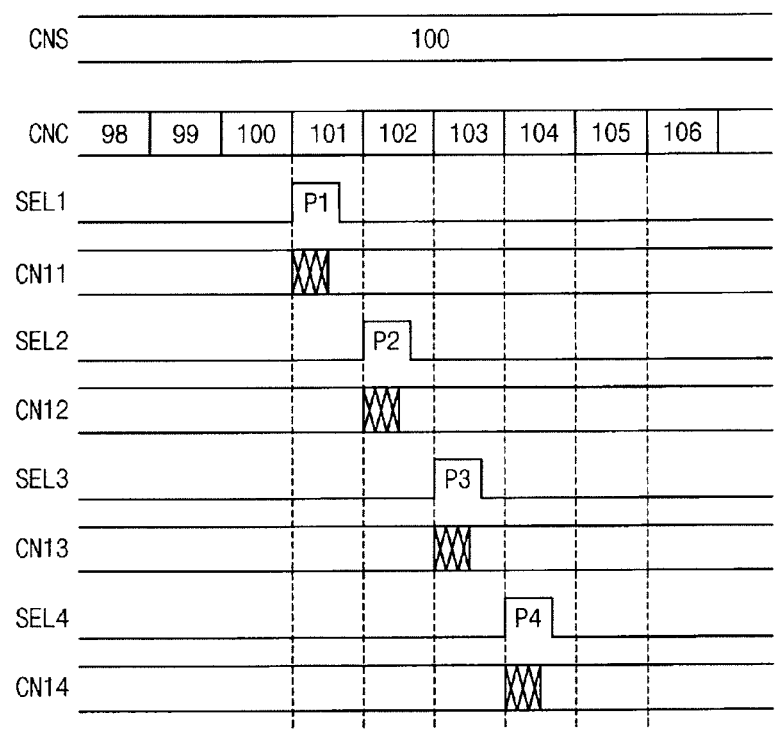
FIG. 18 is a timing diagram illustrating an operation of the time-to-digital converter of FIG. 17, according to an exemplary embodiment.

FIG. 18 is a timing diagram illustrating an operation of the time-to-digital converter of FIG. 17, according to an exemplary embodiment.

Referring to FIGS. 17 and 18, the scan counter 220 stores a value (e.g., 100). In this case, the scan counter 220 outputs the value 100, and the clock counter 210 outputs the value, increasing it by 1 per cyclic period tCLK. The selection signal generator 230 may control the timing of the positive pulse P1 in the first selection signal SEL1 in synchronization with the timing when the output of the clock counter 210 becomes equal to the output of the scan counter 220. The timings of the positive pulses P2, P3 and P4 respectively included in the second, third and fourth selection signals SEL2, SEL3 and SEL4 are sequentially delayed by the cyclic period tCLK of the clock signal CLK.

During the 101th clock cycle, the first counting circuit 53 is enabled in response to the positive pulse P1 of the first selection signal SEL1, and the first counting circuit 53 provides the first value CN11 of the first digital data DGT1 by sampling the output VN1 through VNn of the first detector 43 (e.g., the ring oscillator). During the 102th clock cycle, the second counting circuit 54 is enabled in response to the positive pulse P2 of the second selection signal SEL2, and the second counting circuit 54 provides the second value CN12 of the first digital data DGT1 by sampling the output VN1 through VNn of the first detector 43 (e.g., the ring oscillator). During the 103rd clock cycle, the third counting circuit 55 is enabled in response to the positive pulse P3 of the third selection signal SEL3, and the third counting circuit 55 provides the third value CN13 of the first digital data DGT1 by sampling the output VN1 through VNn of the first detector 43 (e.g., the ring oscillator). During the 104th clock cycle, the fourth counting circuit 56 is enabled in response to the positive pulse P4 of the fourth selection signal SEL4, and the fourth counting circuit 56 provides the fourth value CN14 of the first digital data DGT1 by sampling the output VN1 through VNn of the first detector 43 (e.g., the ring oscillator).

The time-to-digital converter 31a of FIG. 17 may operate in such a burst mode, and may perform the sequential counting using the plurality of counting circuits 53, 54, 55 and 56. FIG. 18 illustrates one set of the burst sampling, which may be repeated. The sampled count values CN11, CN12, CN13 and CN14 may be streamed to the data processing block 90 of FIG. 1, and may be used to reconstruct the waveform of the rapidly varying voltage as illustrated in FIGS. 16A and 16B. For example, the scan counter 220 may store a value of 4 and the clock counter 210 may be a two-bit counter that repeat the values 0, 1, 2 and 3. In this case, each selection signal may include the pulses per four cyclic periods 4*tCLK. Each output of the counting circuits 53, 54, 55 and 56 may include count values per four cyclic periods 4*tCLK, and thus, the four counting circuits 53, 54, 55 and 56 may provide the count values per cyclic period tCLK of the clock signal CLK.

Figure 19:
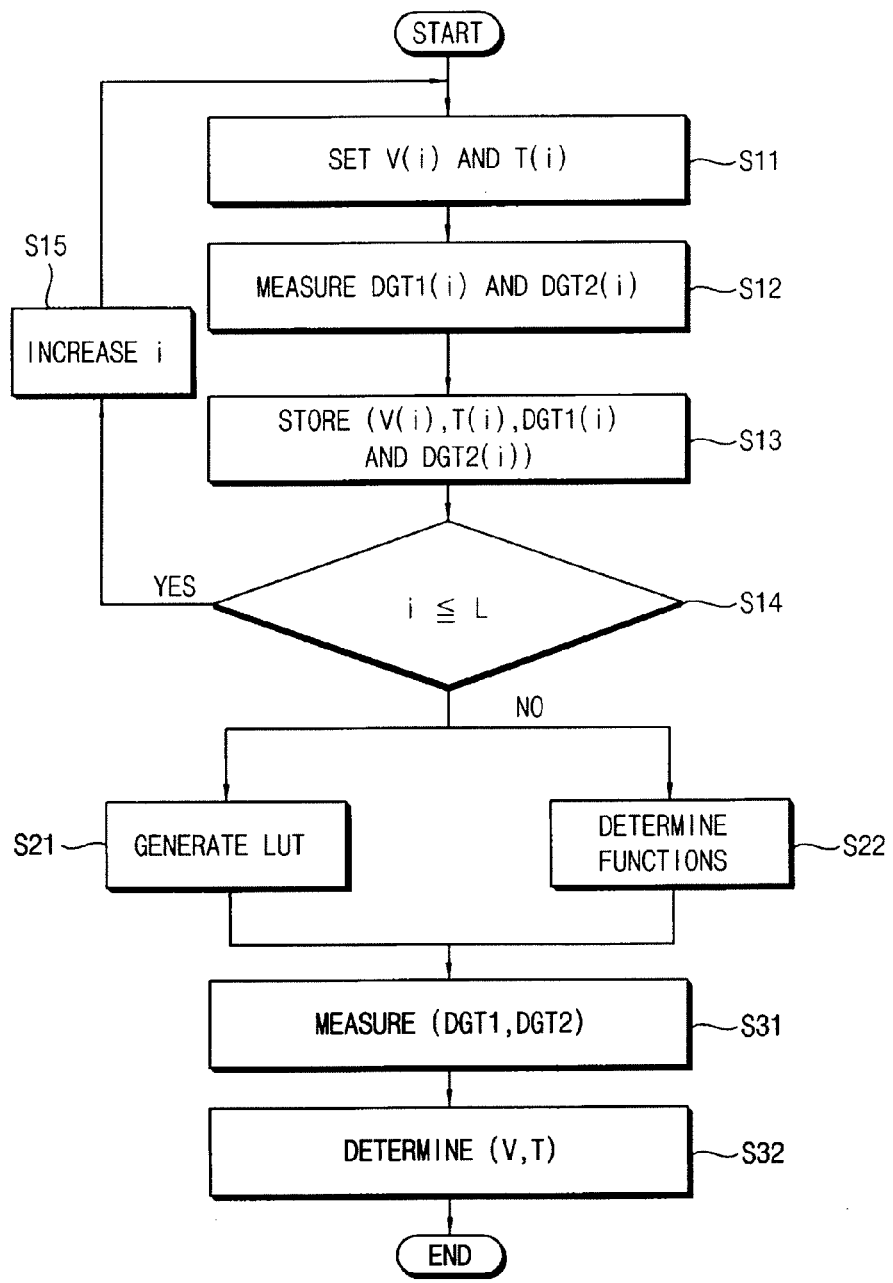
FIG. 19 is a flowchart illustrating a method of measuring a voltage and a temperature, according to exemplary embodiments.

FIG. 19 is a flowchart illustrating a method of measuring a voltage and a temperature, according to exemplary embodiments.

Referring to FIG. 19, the operational voltage V(i) and the operational temperature T(i) of the voltage-temperature sensor 10 are set (block S11), and the first digital data DGT1(i) and the second digital data DGT2(i) corresponding to V(i) and T(i) are measured (block S12). As described above, the first digital data DGT1(i) may be measured using the first converter 31 having the first sensitivity SEN1, and the second digital data DGT2(i) may be measured using the second converter 32 having the second sensitivity SEN2, which is different from the first sensitivity SEN1.

The set voltage and temperature and the measured digital data are stored as a combination (V(i), T(i), DGT1(i), DGT2(i)) (block S13). Blocks S11, S12 and S13 may be repeated by changing the values of V(i) and T(i) (block S15) until the desired number of combinations (V, T, DGT1, DGT2) is obtained (block S14). In block S14, L represents the range of the operational voltage and the operational temperature to be measured, and increasing i in block S15 represents sequentially changing the combination (V(i), T(i)). The obtained combinations (V, T, DGT1, DGT2) may be represented as the graphs in FIGS. 7 and 8.

The calibration results (e.g., the combinations (V, T, DGT1, DGT2)) obtained via blocks S11, S12, S13, S14 and S15 may be represented as a lookup table, or a function that may be used to determine an unknown voltage and temperature by measuring the digital data.

In exemplary embodiments, the lookup table LUT may be generated (block S21), and the lookup table LUT may be stored in the data processing block 90. The combination (DGT1, DGT2) is measured with respect to an unknown voltage and temperature (block S31) by the first and second converters 31 and 32. The data processing block 90 may determine the combination (V, T) of the unknown voltage and temperature corresponding to the combination (DGT1, DGT2) of the measured digital data with reference to the stored lookup table LUT (block S32).

In exemplary embodiments, a voltage function and/or a temperature function of the first and second digital data may be determined (block S22) based on the combinations (V, T, DGT1, DGT2) obtained through blocks S11, S12, S13, S14 and S15.

The functions DGT1(V, T) and DGT2(V, T) may be determined using the combination (V, T, DGT1, DGT2). For example, the functions DGT1(V, T) and DGT2(V, T) may be represented as Expression 1, however, representation of the functions is not limited thereto:

$DGT1(V,T)=a1+a2*T+a3*T^2+a4*V+a5*V^2,$ $DGT2(V,T)=b1+b2*T+b3*T^2+b4*V+b5*V^2$ (Expression 1)

Using the plurality of combinations (V, T, DGT1, DGT2), a plurality of equations with respect to the unknown coefficients ai and bi (e.g., i=1, 2, 3, 4, 5) may be provided. The coefficients ai and bi may be obtained by solving the equations, and thus, the functions DGT1(V, T) and DGT2(V, T) of Expression 1 may be determined. To solve equations greater than the number of the coefficients ai and bi, regression analysis may be used to obtain the coefficients ai and bi. For example, the coefficients ai and bi may be obtained using a least square method, which may decrease errors. The determination of the coefficients ai and bi indicates the determination of the functions DGT1(V, T) and DGT2(V, T).

Once the functions DGT1(V, T) and DGT2(V, T) have been determined by rearranging the parameters, the functions V(DGT1, DGT2) and T(DGT1, DGT2) may be determined. The unknown voltage and temperature may be determined by measuring the digital data DGT1 and DGT2 and calculating the functions V(DGT1, DGT2) and T(DGT1, DGT2).

The data processing block 90 may store the functions representing the relation between the combination (DGT1, DGT2) and the combination (V, T). The first and second converters 31 and 32 measure the first and second digital data DGT1 and DGT2 (block S31) with respect to the unknown voltage and temperature, and the data processing block 90 may determine the combination (V, T) of the unknown voltage and temperature corresponding to the combination (DGT1, DGT2) of the measured digital data using the stored functions (block S32).

Figure 20:
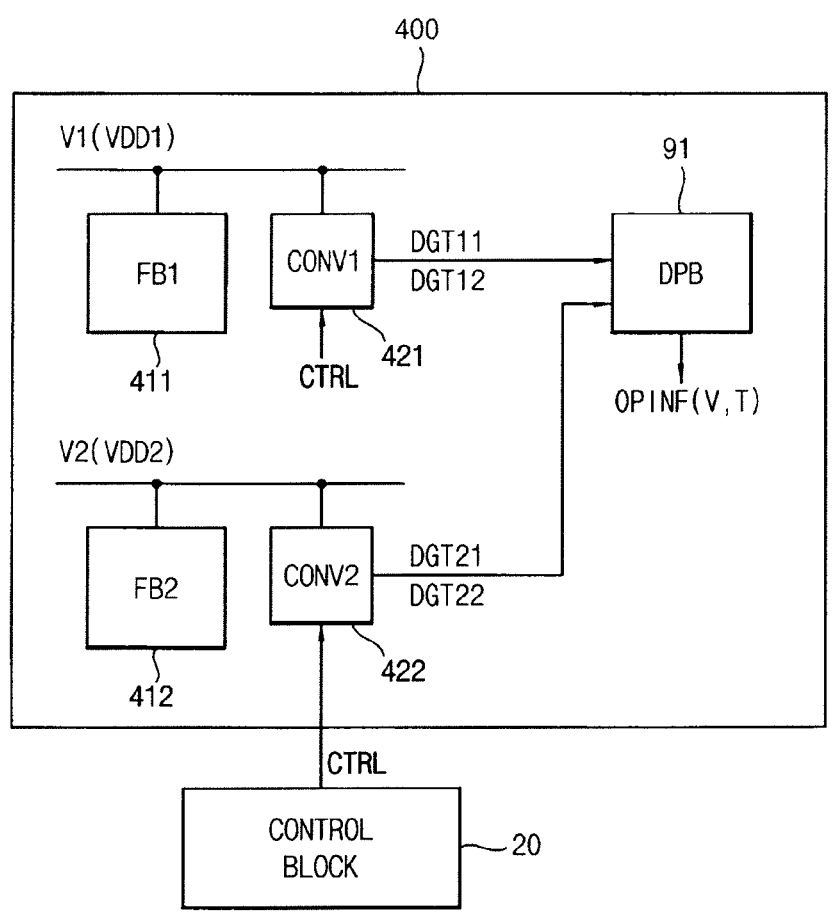
FIG. 20 is a diagram illustrating a system including a voltage-temperature sensor, according to exemplary embodiments.

FIG. 20 is a diagram illustrating a system including a voltage-temperature sensor, according to exemplary embodiments.

Referring to FIG. 20, a system 400 may include a plurality of function blocks 411 and 412, a plurality of converters 421 and 422, and a data processing block 91.

The system 400 may be, for example, a system-on-chip or a system-in-package. Some components in the system 400 may be omitted in FIG. 20 for convenience of description.

The function blocks 411 and 412 may be arbitrary circuits and/or devices that perform respective functions and generate heat in a chip or package. For example, the function blocks 411 and 412 may include at least one of a clock generation circuit, a voltage regulator, a memory core, a processor and/or an interface circuit, however the function blocks 411 and 412 are not limited thereto.

The function blocks 411 and 412 may operate under the respective operational voltage V1 and V2 and the respective operational temperatures. The operational voltages V1 and V2 of the function blocks 411 and 412 may be provided through the same power line or different power lines. The operational voltages V1 and V2 may be different power supply voltages VDD1 and VDD2. For example, the first operation voltage V1 may be the power supply voltage VDD1 applied to the memory core of the semiconductor memory device, and the second operation voltage V2 of the second function block 412 may be the power supply voltage VDD2 applied to the input-output circuit of the semiconductor memory device.

Each of the converters 421 and 422 may be disposed near one of the function blocks 411 and 412. As described above, each of the converters 421 and 422 may generate the first digital data DGT11 or DGT21, and the second digital data DGT12 or DGT22. The first digital data DGT11 or DGT21 varies with respect to the first sensitivity to the operational voltage and the operational temperature of the nearest function block 411 or 412, and the second digital data DGT12 or DGT22 varies with respect to the second sensitivity to the operational voltage and the operational temperature of the nearest function block 411 or 412, which is different from the first sensitivity.

The data processing block 91 may extract the combination (V1, T1) and/or (V2, T2) of the operational voltage and the operational temperature based on the combination (DGT11, DGT12) and/or (DGT21, DGT22) of the first digital data and the second digital data. The extracted combination (V, T) or the operational information OPINF(T, V) that is further processed from the extracted combination (V, T) may be provided to the main processor in the system 400.

The data processing block 91 and/or the converters 421 and 422 may be controlled based on the control signal CTRL provided from the control block 20. The control block 20 may be, for example, an external test device or an internal timing controller.

In exemplary embodiments, the voltage-temperature sensor 10 may be used in chip-error debugging. In designing a chip, a plurality of converters 421 and 422 may be disposed at different portions of the chip, as illustrated in FIG. 20. After the chip is integrated, the operational characteristics of the converters 421 and 422 are measured through the calibration processes (blocks S11, S12, S13, S14 and S15 of FIG. 19), and the calibration results are provided to the data processing block 91. If errors occur in the operation of the system 400, the corresponding stimulus and/or conditions are recorded. Using the converters 421 and 422 distributed in the system 400, the causes of malfunction of the system 400 may be analyzed.

In exemplary embodiments, the voltage-temperature sensor 10 may be used in real-time monitoring of the system 400. For example, the converters 421 and 422 may be disposed near the various function blocks 411 and 412 including, for example, a processor, a clock generator, a voltage regulator, etc., and may measure the local voltages and the local temperatures. The measurement results are provided to the data processing block 91 in real-time, and the operational voltage or the clock frequency of the system 400 or the respective function blocks 411 and 412 may be controlled based on the operational information OPINF(V, T) provided from the data processing block 91. For example, when the operational information OPINF(V, T) indicates that the temperature has abnormally increased, the corresponding clock frequency may be reduced, or the power of the system 400 may be shut down to prevent damage to the system 400.

As such, the voltage-temperature sensor according to exemplary embodiments may be used in arbitrary devices and systems requiring a precise measurement of the operational voltage and/or the operational temperature. The voltage-temperature sensor may be used, for example, in debugging errors in the system and real-time monitoring of the system.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A voltage-temperature sensor, comprising:
    a first converter configured to generate a first digital data based on an operational voltage and an operational temperature, wherein the first converter has a first sensitivity to the operational voltage and the operational temperature;
    a second converter configured to generate a second digital data based on the operational voltage and the operational temperature, wherein the second converter has a second sensitivity to the operational voltage and the operational temperature, and the second sensitivity is different from the first sensitivity; and
    a data processing block configured to determine and output a combination of an unknown value of the operational voltage and an unknown value of the operational temperature based on a combination of the first digital data and the second digital data,
    wherein each of the first converter and the second converter is a time-to-digital converter configured to respectively generate a detection signal, the detection signals have temporal characteristics based on the operational voltage and the operational temperature, and the first digital data and the second digital data are generated based on the detection signals.

2. The voltage-temperature sensor of claim 1, wherein the first converter is more sensitive to the operational voltage than to the operational temperature, and the second converter is more sensitive to the operational temperature than the first converter.

3. The voltage-temperature sensor of claim 1, wherein the data processing block comprises a lookup table configured to store a plurality of combinations of the operational voltage and the operational temperature, and a plurality of corresponding combinations of the first digital data and the second digital data, wherein the combinations of the first and second digital data are measured by varying values of the combinations of the operational voltage and the operational temperature, and
    the data processing block is configured to determine the combination of the unknown value of the operational voltage and the unknown value of the operational temperature based on the lookup table.

4. The voltage-temperature sensor of claim 1, wherein the data processing block is configured to store a function representing a relation between a combination of the operational voltage and the operational temperature and the combination of the first digital data and the second digital data, and
    the data processing block is configured to use the function to determine the combination of the unknown value of the operational voltage and the unknown value of the operational temperature.

5. The voltage-temperature sensor of claim 4, wherein a plurality of combinations of the first digital data and the second digital data are measured by varying a plurality of combinations of the operational voltage and the operational temperature, and the function is determined using a least mean square method based on measurement results.

6. The voltage-temperature sensor of claim 1, wherein each of the first converter and the second converter comprises:
    a ring oscillator comprising a plurality of inverters having one of a first delay time corresponding to the first sensitivity, or a second delay time corresponding to the second sensitivity; and a digital quantifier configured to generate the first digital data or the second digital data based on output oscillating signals provided from nodes disposed between each of the plurality of inverters.

7. The voltage-temperature sensor of claim 6, wherein each inverter in the ring oscillator of the first converter comprises one p-type metal oxide semiconductor (PMOS) transistor and one n-type metal oxide semiconductor (NMOS) transistor coupled between the operational voltage and a ground voltage, and each inverter in the ring oscillator of the second converter includes one PMOS transistor, one NMOS transistor and one diode-coupled NMOS transistor coupled between the operational voltage and the ground voltage.

8. The voltage-temperature sensor of claim 6, wherein the digital quantifier comprises a plurality of counters configured to generate count signals corresponding to the first digital data or the second digital data based on the output oscillating signals.

9. The voltage-temperature sensor of claim 8, wherein one of the plurality of counters is configured to generate a multi-bit count signal based on an edge count of a corresponding output oscillating signal, and each of a remainder of the plurality of the counters is configured to generate one-bit count signals, wherein each one-bit count signal transitions between a logic high level and a logic low level at an edge of a corresponding output oscillating signal.

10. The voltage-temperature sensor of claim 6, wherein the ring oscillator is enabled in response to a clock signal, and the ring oscillator is configured to perform a periodic oscillation per cycle of the clock signal.

11. The voltage-temperature sensor of claim 10, wherein the digital quantifier is configured to output the first digital data or the second digital data periodically corresponding to the periodic oscillation of the ring oscillator.

12. The voltage-temperature sensor of claim 10, wherein the digital quantifier of the first converter comprises a plurality of counting circuits configured to be sequentially enabled in response to a plurality of selection signals, wherein the plurality of counting circuits are configured to sequentially output the first digital data corresponding to the periodic oscillation of the ring oscillator, and the selection signals are sequentially activated per cycle of the clock signal.

13. The voltage-temperature sensor of claim 12, further comprising:
a scan counter configured to store a value representing an operational timing of the first counter;
a clock counter configured to count a number of cycles of the clock signal; and
a selection signal generator configured to compare an output of the scan counter and an output of the clock counter, wherein the selection signals are generated based on a resulting comparison, and the selection signals are sequentially activated.

14. A system, comprising:
a plurality of function blocks;
a plurality of converters, wherein each converter is disposed near one of the plurality of function blocks and is configured to generate a first digital data and a second digital data, wherein the first digital data varies with respect to a first sensitivity to an operational voltage and an operational temperature of a nearest function block, the second digital data varies with respect to a second sensitivity to the operational voltage and the operational temperature of the nearest function block, and the second sensitivity is different from the first sensitivity; and
a data processing block configured to determine and output a combination of values comprising a first value and a second value based on a combination of the first digital data and the second digital data, wherein the first value is a voltage value corresponding to an unknown value of the operational voltage and the second value is a temperature value corresponding to an unknown value of the operational temperature.

15. The system of claim 14, wherein at least two of the plurality of function blocks operate based on different power supply voltages.

16. The system of claim 14, wherein the plurality of function blocks comprise at least one of a clock generation circuit, a voltage regulator, a memory core, a processor or an interface circuit.

17. A method of measuring a voltage and a temperature, comprising:
measuring a first digital data and a second digital data, wherein the first digital data is measured with respect to a first sensitivity to an operational voltage and an operational temperature, the second digital data is measured with respect to a second sensitivity to the operational voltage and the operational temperature, and the second sensitivity is different from the first sensitivity; and
determining and outputting a combination of values comprising a first value and a second value based on a combination of the first digital data and the second digital data, wherein the first value is a voltage value corresponding to an unknown value of the operational voltage and the second value is a temperature value corresponding to an unknown value of the operational temperature.

18. The method of claim 17, further comprising:
storing a plurality of combinations of the operational voltage and the operational temperature, and a plurality of corresponding combinations of the first digital data and the second digital data in a lookup table,
wherein the combinations of the first and second digital data are measured by varying values of the combinations of the operational voltage and the operational temperature,
wherein determining the combination of the unknown value of the operational voltage and the unknown value of the operational temperature is based on the lookup table.

19. The method of claim 17, further comprising:
storing a function representing a relation between a combination of the operational voltage and the operational temperature and the combination of the first digital data and the second digital data,
wherein determining the combination of the unknown value of the operational voltage and the unknown value of the operational temperature is based on the function.

* * * * *